(12) United States Patent
Filippi et al.

(10) Patent No.: US 9,059,166 B2
(45) Date of Patent: Jun. 16, 2015

(54) INTERCONNECT WITH HYBRID METALLIZATION

(71) Applicant: International Business Machines Corporation, Armonk, NY (US)

(72) Inventors: Ronald G. Filippi, Wappingers Falls, NY (US); Erdem Kaltalioglu, Newburgh, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 13/890,560

(22) Filed: May 9, 2013

(65) Prior Publication Data

US 2014/0332963 A1 Nov. 13, 2014

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/76805* (2013.01); *H01L 21/76885* (2013.01); *H01L 21/76834* (2013.01); *H01L 2924/0002* (2013.01); *H01L 23/53223* (2013.01); *H01L 23/53238* (2013.01); *H01L 23/53295* (2013.01)

(58) Field of Classification Search
CPC ............... H01L 21/76805; H01L 21/76834; H01L 21/76885; H01L 23/5226
See application file for complete search history.

(56) References Cited

U.S. PATENT DOCUMENTS

| | | | | |
|---|---|---|---|---|
| 5,233,223 A | * | 8/1993 | Murayama | 257/770 |
| 5,439,731 A | | 8/1995 | Li et al. | |
| 5,470,788 A | * | 11/1995 | Biery et al. | 438/648 |
| 6,037,253 A | * | 3/2000 | Chung | 438/639 |
| 6,054,389 A | * | 4/2000 | Cheng | 438/692 |
| 6,071,810 A | * | 6/2000 | Wada et al. | 438/635 |
| 6,245,996 B1 | | 6/2001 | Atakov et al. | |
| 6,319,823 B1 | * | 11/2001 | Liu et al. | 438/637 |
| 6,359,329 B1 | * | 3/2002 | Kikuta | 257/622 |
| 6,426,544 B1 | | 7/2002 | Ryan et al. | |
| 6,597,067 B1 | * | 7/2003 | Biery et al. | 257/751 |
| 8,138,603 B2 | | 3/2012 | Hsu et al. | |
| 2002/0187643 A1 | * | 12/2002 | Gu et al. | 438/694 |
| 2005/0208760 A1 | * | 9/2005 | Ryan | 438/639 |
| 2008/0124917 A1 | * | 5/2008 | Oh et al. | 438/637 |
| 2013/0043591 A1 | * | 2/2013 | Yang et al. | 257/751 |
| 2014/0027822 A1 | * | 1/2014 | Su et al. | 257/288 |
| 2014/0061917 A1 | * | 3/2014 | Kim et al. | 257/751 |
| 2014/0080302 A1 | * | 3/2014 | Matsuda et al. | 438/660 |

(Continued)

*Primary Examiner* — Joseph C Nicely
(74) *Attorney, Agent, or Firm* — L. Jeffrey Kelly; Catherine Ivers

(57) ABSTRACT

An electronic interconnect structure having a hybridized metal structure near regions of high operating temperature on an integrated circuit, and methods of making the same. The hybridized metal structure features at least two different metals in a single metallization level. The first metal is in a region of high operating temperature and the second region is in a region of normal operating temperatures. In a preferred embodiment the first metal includes aluminum and is in a first level metallization over an active area of the device while the second metal includes copper. In some embodiments, the first and second metals are not in direct physical contact. In other embodiments the first and second metals physically contact each other. In a preferred embodiment, a top surface of the first metal is not co-planar with a top surface of the second metal, despite being in the same metallization level.

13 Claims, 4 Drawing Sheets

(56) References Cited

U.S. PATENT DOCUMENTS

| | | | |
|---|---|---|---|
| 2014/0120717 A1* | 5/2014 | Huang et al. | 438/653 |
| 2014/0167268 A1* | 6/2014 | Bao et al. | 257/761 |
| 2014/0319685 A1* | 10/2014 | Bao et al. | 257/751 |
| 2014/0332965 A1* | 11/2014 | Bao et al. | 257/768 |
| 2014/0346674 A1* | 11/2014 | Bao et al. | 257/741 |

* cited by examiner

INTERCONNECT WITH HYBRID METALLIZATION

BACKGROUND

1. Field of the Invention

The present invention relates generally to semiconductors, and more particularly, to electronic interconnect structures having at least two different metals in a single metallization layer.

2. Background of Invention

Scaling down of active device dimensions in the manufacture of integrated circuits (IC) has improved circuit performance and increased the complexity and capability of the active devices packed on a semiconductor substrate. The high density ICs run at a higher and higher temperature. High temperature increases the likelihood of electromigration (EM) failure of interconnect structures within the IC.

In multi-finger applications in which the layout of the devices is such that the metal lines may be arranged in parallel stripes or fingers, these fingers may carry significant current densities and current limiting mechanisms, including electromigration, are a major concern. Such devices include: power amplifiers, RF switches, I/O drivers, small analog devices operating near peak ft, devices with moderate current densities but operating at high ambient temperature (above 80° C.) or chips that develop a large amount of heat during operation, and any device with long fingers.

Accordingly, an interconnect structure which is resistant to EM despite high operating temperatures is needed.

SUMMARY

According to one embodiment of the present invention, a method is provided. The method may include forming a first interconnect structure in a dielectric layer, and forming a second interconnect structure in the dielectric layer, the first interconnect structure and the second interconnect structure being formed from different materials.

According another exemplary embodiment of the present invention, a structure is provided. The structure may include a first interconnect structure, and a second interconnect structure, the first interconnect structure and the second interconnect structure being different materials. The first interconnect structure and the second interconnect structure are both within the same metallization level, and a top surface of the first interconnect structure is not co-planar with a top surface of the second interconnect structure.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
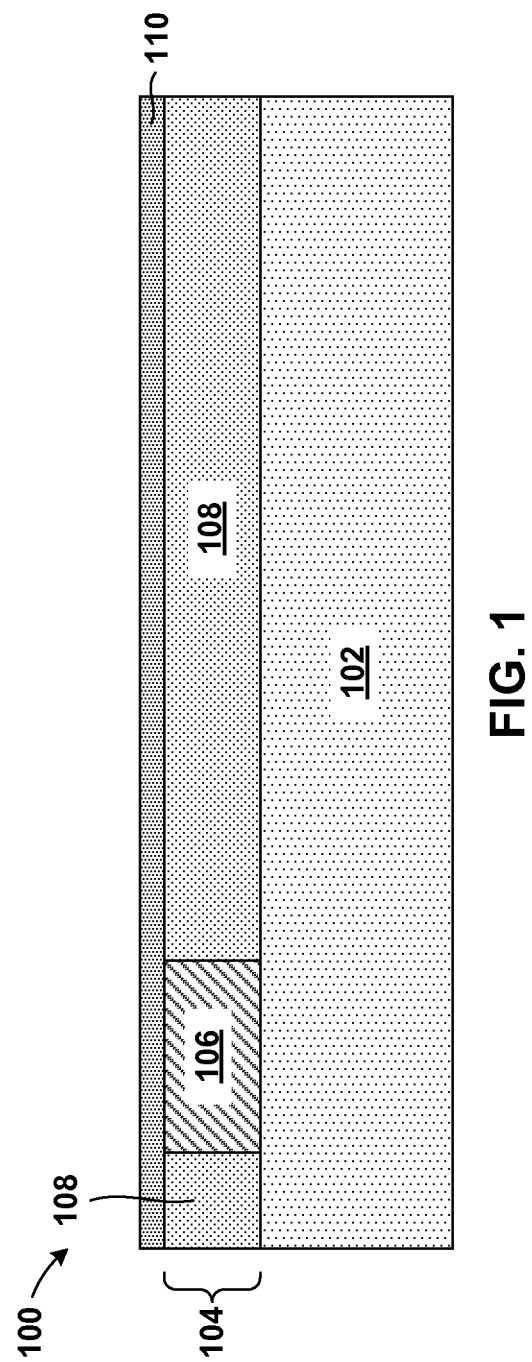
FIG. 1 illustrates the formation of a metallization level having a first interconnect structure, a dielectric layer, and a cap dielectric according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

To address the aforementioned problem, the present invention provides electronic interconnect structures having a hybridized metallization structure. The hybridized metallization structure may feature at least two different metals in a single metallization level. The first metal may be situated in a region of high operating temperature and the second metal may be situated in a region of normal operating temperatures. In one embodiment, a single metallization level may include two individual interconnect structures, separate from one another, each made of a different conductive material. In another embodiment, a single metallization level may include a single interconnect structure made of two discreet conductive materials in direct contact with one another. In both embodiments, one conductive material may be chosen for its low resistivity and good electromigration reliability, and the other chosen for similar properties at elevated operating temperatures. It should be noted that all temperatures relevant to the following description are operating temperatures and not processing temperatures. Operating temperatures may include any temperature an interconnect structure may experience during normal operation as compared to any temperature experienced by the interconnect structure during fabrication and processing. Furthermore, normal operating temperatures may include temperatures at or about 75° C. to about 100° C., and elevated operational temperatures may include temperatures at or above about 100° C. and in particular, temperatures equal to or greater than about 125° C. or even equal to or greater than about 150° C.

Areas of an integrated circuit that may experience high operating temperatures may include areas of high interconnect density, especially when those interconnects are minimum width; areas over active areas, particularly those areas over a contact (source, drain, gate, collector, base or emitter contact) to a silicon containing substrate; areas having a multi-finger layout such that the metal lines may be arranged in parallel stripes or fingers, particularly when these fingers carry significant current densities; or areas including power amplifiers, RF switches, I/O drivers. Devices which are susceptible to EM caused by high operating temperatures may include bipolar devices, small analog devices operating near peak ft, devices with moderate current densities but operating at high ambient temperature (above 80° C.) and other devices within the above described areas.

More specifically, multilayer electronic components comprise multiple levels of a dielectric material having metallization on each level in the form of vias, pads, straps connecting pads to vias, and wiring. Vias or other openings in the dielectric layer extend from one level to another level. These openings are filled with a conductive material and electrically connect the metallization of one level to the metallization of another level and provide for the high density electronic component devices now used in industry. The metallization of each level may be formed using a filling technique such as electroplating, electroless plating, chemical vapor deposition, physical vapor deposition or a combination of methods. The metallization and dielectric layer may be capped with a cap dielectric, which may be, for example, nitride.

Ideally, low resistivity and good electromigration resistance across a broad range of temperatures is preferable of any interconnect structure. One way to achieve both low resistivity and good electromigration resistance for a broad range of temperatures may include forming a single metallization level having one or more interconnect structures with different materials, each strategically positioned based on the operating temperature of the corresponding interconnect. Thus, one interconnect which may experience elevated operating temperatures may include one conductive material and another interconnect which may experience normal operating temperatures may include a different conductive material. One embodiment by which to fabricate interconnect structures within a single metallization level having two different conductive materials is described in detail below by referring to the accompanying drawings FIGS. 1-2. In the present embodiment, two interconnect structures, each formed from a different conductive material, may be formed in a single metallization level using both a metal RIE and a single damascene integration scheme.

Referring now to FIG. 1, a structure 100 is shown. The structure 100 may include a substrate 102 and a metallization level 104. The substrate 102 may include a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. The metallization level 104 may include a first interconnect structure 106, a dielectric layer 108, and a first cap dielectric 110. The metallization level 104 may represent any interconnect level in the structure 100. In one embodiment, the metallization level 104 may represent a metallization level directly above a contact level or an active device level. It should be noted that while only a single interconnect level is shown, in some embodiments the structure 100 may have multiple interconnect levels either above, below, or above and below the metallization level 104. The first interconnect structure 106 may consist of a typical line or wire found in a typical semiconductor circuit.

The first interconnect structure 106 may be formed by any suitable metal etching technique known in the art. A suitable metal etching technique is one that is suited to etch the material of the first interconnect structure 106. Formation of the first interconnect structure 106 may include depositing a metal layer, lithographically patterning a mask above the metal layer, and removing a portion of the metal layer. The metal layer may be formed using conventional deposition methods, for example, chemical vapor deposition, low-pressure chemical vapor deposition, atomic layer deposition, or physical vapor deposition. The metal layer, and thus the first interconnect structure 106, may include any metal suitable for interconnect structures, such as, for example aluminum.

After the metal layer is deposited above the substrate 102, a photoresist material may be deposited above the metal layer and lithographically patterned to form the mask. The photoresist material may be patterned by exposing the photoresist to a desired pattern of radiation and developing the exposed photoresist utilizing a conventional resist developer. The mask or pattern in the photoresist may then be transferred to the metal layer using one or more dry etching techniques. Suitable dry etching techniques may include, but are not limited to: reactive ion etching (RIE), ion beam etching, plasma etching, or laser ablation. In one embodiment, a RIE technique using, for example, a chlorine based etchant including $BCl_3$, $CHCl_3$, or $Cl_2$, may be used to transfer the mask pattern into the metal layer and thus form the first interconnect structure 106. The patterned photoresist may then be removed by resist stripping after etching has been completed. The mask may include well known photoresist materials, for example, a soft mask, and could be either positive or negative in tone. Optionally, a non-contact or a hardmask may be used.

The first interconnect structure 106 may be strategically positioned in an area of the structure 100 expected to experience elevated operating temperatures. The material from which the first interconnect structure 106 may be formed, can be specifically chosen for its low resistivity and good electromigration resistance at elevated operating temperatures. In one embodiment, the first interconnect structure 106 may include aluminum fabricated using a chemical vapor deposition technique followed by a RIE technique. In the present embodiment, aluminum may be chosen for its low resistivity and electromigration characteristics, and thus good reliability, at elevated operating temperatures above about 100° C. Generally, the first interconnect structure 106 may be any suitable thickness preferred for the corresponding interconnect function. In one embodiment, the first interconnect structure 106 may have a thickness ranging from about 100 nm to about 500 nm and ranges there between, although a thickness less than 100 nm and greater than 500 nm may be acceptable.

With continued reference to FIG. 1, the dielectric layer 108 may then be deposited above the substrate 102 and above the first interconnect structure 106. The dielectric layer 108 may include any suitable dielectric material, for example, silicon oxide ($SiO_2$), silicon nitride ($Si_3N_4$), hydrogenated silicon carbon oxide (SiCOH), silicon based low-k dielectrics, or porous dielectrics. Known suitable deposition techniques, such as, for example, atomic layer deposition, chemical vapor deposition, or physical vapor deposition may be used to form the dielectric layer 108. The dielectric layer 108 may have a typical thickness ranging from about 100 nm to about 500 nm and ranges there between, although a thickness less than 100 nm and greater than 500 nm may be acceptable. A chemical mechanical polishing technique may be applied to remove excess dielectric material prior to depositing the first cap dielectric 110 above the dielectric layer 108 and the first interconnect structure 106. The chemical mechanical polishing technique may polish the structure 100 selective to the first interconnect structure 106 and expose the first interconnect structure 106.

The first cap dielectric 110 may then be deposited over the structure 100, and above the first interconnect structure 106 and above the dielectric layer 108. The first cap dielectric 110 may electrically insulate the metallization level 104 from additional interconnect levels (not shown) that may be subsequently formed above the metallization level 104. The first cap dielectric 110 may be deposited using typical deposition techniques, for example, chemical vapor deposition. The first cap dielectric 110 may include, for example, silicon nitride (Si$_3$N$_4$), silicon carbide (SiC), silicon carbon nitride (SiCN), hydrogenated silicon carbide (SiCH), or other known capping materials. The first cap dielectric 110 may have a thickness ranging from about 5 nm to about 50 nm and ranges there between, although a thickness less than 5 nm and greater than 50 nm may be acceptable.

Figure 2:
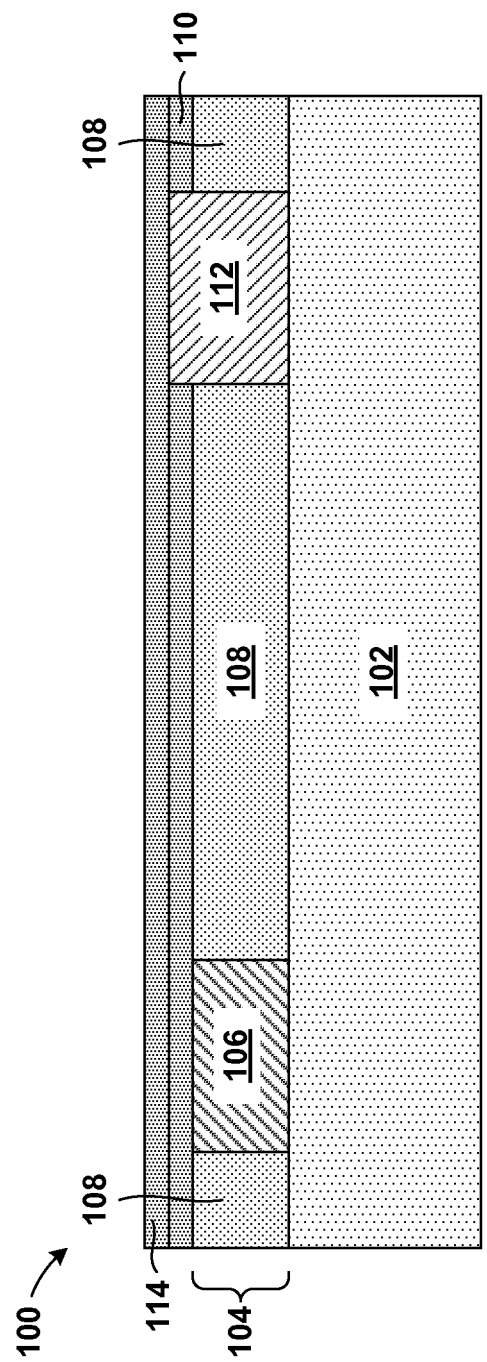
FIG. 2 illustrates the formation of a second interconnect structure in the metallization level according to an exemplary embodiment.

Now referring to FIG. 2, a second interconnect structure 112 may be formed in the dielectric layer 108 in accordance with typical lithography techniques. The second interconnect structure 112 may be fabricated using, for example, a typical single or dual damascene technique in which a conductive interconnect material may be deposited in a trench formed in the dielectric layer 108. A single damascene technique is relied on to describe the present embodiment.

In instances where a dual damascene integration scheme is used, either the first interconnect structure 106 or the second interconnect structure 112 may be formed above an underlying interconnect structure (not shown). In such cases, the underlying interconnect structure may include a metal line, a via, or a contact made of copper, aluminum, or tungsten.

With continued reference to FIG. 2, first a trench may be formed in the dielectric layer 108 and then subsequently filled with a conductive interconnect material to form the second interconnect structure 112. The trench may be formed using any suitable masking and etching technique known in the art. In one embodiment, a dry etching technique using a fluorine based etchant, such as, for example C$_x$F$_y$, may be used. Next, a conductive interconnect material may be deposited within the trench and above the first cap dielectric 110. The second interconnect structure 112 may be formed using a filling technique such as electroplating, electroless plating, chemical vapor deposition, physical vapor deposition or a combination of methods. The second interconnect structure 112, may include any metal suitable for interconnect structures, such as, for example, copper, or tungsten. It should be noted that the second interconnect structure 112 is comprised of a different bulk conductor material than first interconnect structure 106. For example, in one embodiment, the first interconnect structure 106 may include aluminum and the second interconnect structure 112 may include copper. In an alternative embodiment, the first interconnect structure 106 may include aluminum with copper doping and the second interconnect structure 112 may include copper with aluminum doping.

A seed layer (not shown) may first be deposited within the trench in instances where a plating technique is used to form the second interconnect structure 112. The seed layer may include any suitable conductive interconnect material similar to that used in the formation of the second interconnect structure 112. In one embodiment, the second interconnect structure 112 may include various barrier liners (not shown). One barrier liner may include, for example, tantalum nitride (TaN), followed by an additional layer including tantalum (Ta). Other barrier liners may include cobalt (Co), or ruthenium (Ru) either alone or in combination with any other suitable liner.

The second interconnect structure 112 may be strategically positioned in an area of the structure 100 expected to experience normal operating temperatures. The material from which the second interconnect structure 112 may be formed, may be specifically chosen for its superior resistivity and good electromigration resistance at normal operating temperatures. In one embodiment, the second interconnect structure 112 may include copper fabricated using a damascene technique. In the present embodiment, copper may be chosen for it superior resistivity and electromigration characteristics, and thus good reliability, at normal operating temperatures at or below about 75° C. to about 100° C. Generally, the second interconnect structure 112 may have any suitable thickness preferred for the corresponding interconnect function. In one embodiment, the second interconnect structure 112 may have a thickness ranging from about 100 nm to about 500 nm and ranges there between, although a thickness less than 100 nm and greater than 500 nm may be acceptable.

A chemical mechanical polishing technique may be applied to remove excess conductive interconnect material prior to depositing a second cap dielectric 114 above the second interconnect structure 112 and above the first cap dielectric 110. The chemical mechanical polishing technique may polish the structure 100 selective to and expose the second interconnect structure 112. The second cap dielectric 114 may be substantially similar in all respects to the first cap dielectric 110 described above. It should be noted that the second interconnect structure 112 may be thicker than the first interconnect structure 106 by an amount approximately equal to the thickness of the first cap dielectric 110.

Alternatively, in another embodiment, another chemical mechanical polishing technique may be applied to the structure 100 of FIG. 2 to remove the first and second cap dielectrics 110, 114. In doing so a top surface of the first interconnect structure 106 may be polished flush with, or co-planar with, a top surface of the second interconnect structure 112.

Another embodiment by which to fabricate interconnect structures within a single metallization level having two different conductive materials is described in detail below by referring to the accompanying drawings FIGS. 3-4. In the present embodiment, a single interconnect structure made of two discrete conductive materials, in direct contact with each other, may be formed in a single metallization level using both a metal RIE and a single damascene integration scheme.

Figure 3:
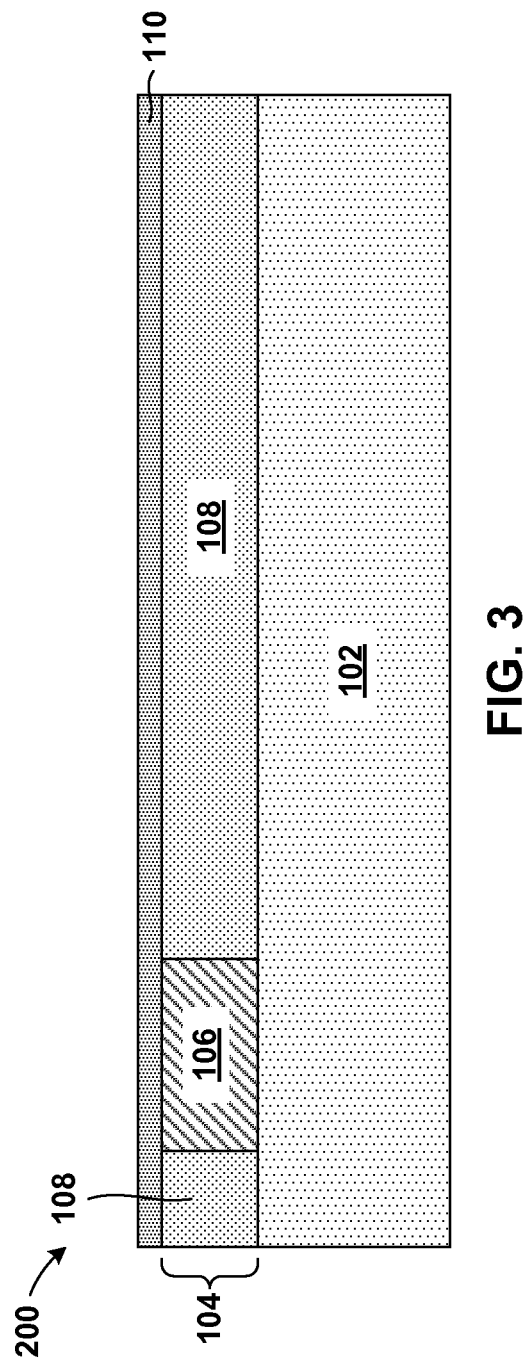
FIG. 3 illustrates the formation of a metallization level having a first metal, a dielectric layer, and a cap dielectric according to an exemplary embodiment.

Referring now to FIG. 3, a structure 200 is shown. The structure 200 may include the substrate 102 and the metallization level 104. The metallization level 104 may include the first interconnect structure 106, the dielectric layer 108, and the first cap dielectric 110. The metallization level 104 may represent any interconnect level in the structure 200. In one embodiment, the metallization level 104 may represent a metallization level directly above a contact level or an active device level. It should be noted that while only a single interconnect level is shown, in some embodiments the structure 200 may have multiple interconnect levels either above, below, or above and below the metallization level 104. The first interconnect structure 106 may make up a portion of a single interconnect structure which may consist of a typical line or wire found in a typical semiconductor circuit.

The first interconnect structure 106 may be formed according to the fabrication techniques described in detail above. Also similar to the above embodiment, the dielectric layer 108 may be deposited above the substrate 102 and above the first interconnect structure 106, and then subsequently polished selective to the first interconnect structure 106. The first cap dielectric 110 may be formed above the first interconnect structure 106 and above the dielectric layer 108 according to the description above.

Like above, the first interconnect structure 106 may be strategically positioned in a portion of the structure 100 expected to experience elevated operating temperatures. The material from which the first interconnect structure 106 may be formed, can be specifically chosen for its low resistivity and good electromigration resistance at elevated operating temperatures. In one embodiment, the first interconnect structure 106 may include aluminum fabricated using a chemical vapor deposition technique followed by a RIE technique. In the present embodiment, aluminum may be chosen for it low resistivity and electromigration characteristics, and thus good reliability, at elevated operating temperatures above about 100° C.

Figure 4:
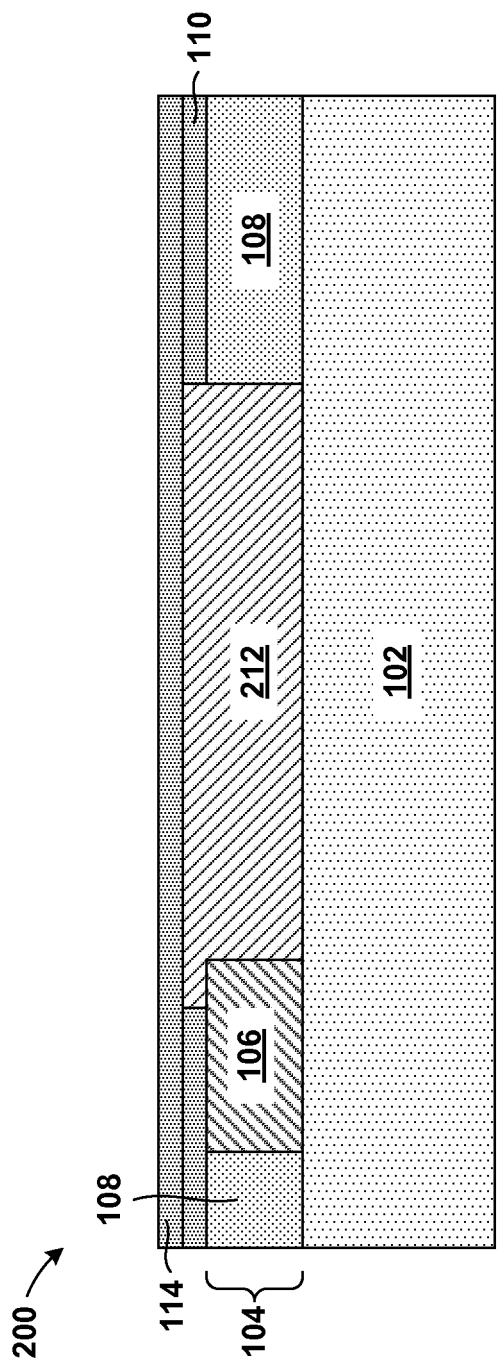
FIG. 4 illustrates the formation of a second metal formed in the metallization level in direct contact with the first metal according to an exemplary embodiment.

Referring now to FIG. 4, a second interconnect structure 212 may be formed in the dielectric layer 108 in direct contact with the first interconnect structure 106, and in accordance with typical lithography techniques. The first interconnect structure 106 together with the second interconnect structure 212 may form the single interconnect structure referred to above. The second interconnect structure 212 may be substantially similar to the second interconnect structure 112 detailed above Like the second interconnect structure 112 above, the second interconnect structure 212 may be fabricated using, for example, a typical single or dual damascene technique in which a conductive interconnect material may be deposited in a trench formed in the dielectric layer 108. A single damascene technique is relied on to describe the present embodiment.

In instances where a dual damascene integration scheme is used, either the first interconnect structure 106 or the second interconnect structure 212 may be formed above an underlying interconnect structure (not shown). In such cases, the underlying interconnect structure may include a metal line, a via, or a contact made of copper, aluminum, or tungsten.

With continued reference to FIG. 4, a trench may be formed in the dielectric layer 108 and then subsequently filled with a conductive interconnect material to form the second interconnect structure 212 in substantially the same manner as described above. Unlike above, the trench may be patterned such that it overlaps the first interconnect structure 106. Therefore, a portion of the first interconnect structure 106 may be exposed at one end of the trench, and a portion of the first cap dielectric 110 may be removed from above the first interconnect structure 106.

The trench may then be filled with a conductive interconnect material to form the single interconnect structure including the first interconnect metal 106 and the second interconnect structure 212. In the present embodiment, the first interconnect metal 106 and the second interconnect structure 212 may be in direct contact with one another, as illustrated in the figure. Generally, the second interconnect structure 212 may be substantially similar to the second interconnect structure 112 above, and may be strategically positioned in a portion of the single interconnect structure expected to experience normal operating temperatures. The material from which the second interconnect structure 212 may be formed, may be specifically chosen for its superior resistivity and good electromigration resistance at normal operating temperatures. In one embodiment, the second interconnect structure 212 may include copper deposited using a damascene technique. In the present embodiment, copper may be chosen for it superior resistivity and electromigration characteristics, and thus good reliability, at normal operating temperatures at or below about 75° C. to about 100° C.

It should be noted that the second interconnect structure 212 is comprised of a different bulk conductor material than first interconnect structure 106. For example, in one embodiment, the first interconnect structure 106 may include aluminum and the second interconnect structure 212 may include copper. In an alternative embodiment, the first interconnect structure 106 may include aluminum with copper doping and the second interconnect structure 212 may include copper with aluminum doping.

Lastly, a chemical mechanical polishing technique may be applied to remove excess conductive interconnect material prior to depositing the second cap dielectric 114 above the second interconnect structure 212 and the first cap dielectric 110. The chemical mechanical polishing technique may polish the structure 200 selective to and expose the second interconnect structure 212.

Alternatively, in another embodiment, another chemical mechanical polishing technique may be applied to the structure 200 of FIG. 4 to remove the first and second cap dielectrics 110, 114. In doing so a top surface of the first interconnect structure 106 may be polished flush with, or co-planar with, a top surface of the second interconnect structure 212.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a first interconnect structure in a dielectric layer; and
   forming a second interconnect structure in the dielectric layer, the first interconnect structure and the second interconnect structure being formed from different materials; wherein the second interconnect structure is in physical contact with the first interconnect structure; wherein the first interconnect structure is formed in a region of a structure which experiences elevated operating temperatures; wherein the second interconnect structure is formed in a region of the structure which experiences normal operating temperatures.

2. The method of claim 1, wherein for forming the first interconnect structure in a dielectric layer comprises:
   depositing a metal layer;
   removing a portion of the metal layer; and
   depositing the dielectric layer to form the first interconnect structure.

3. The method of claim 1, wherein forming the first interconnect structure in a dielectric layer comprises:
   etching a trench in the dielectric layer;
   depositing a metal within the trench and above the a first cap dielectric; and
   removing an excess portion of the metal to form the first interconnect structure.

4. The method of claim 1, wherein forming the second interconnect structure in the dielectric layer comprises:
   etching a trench through a first cap dielectric into the dielectric layer;
   depositing a metal within the trench and above the first cap dielectric; and
   removing an excess portion of the metal from above the first cap dielectric to form the second interconnect structure.

5. The method of claim 1, further comprising forming a portion of the second interconnect structure above a portion of the first interconnect structure.

6. The method of claim 1, further comprising:
   forming a first cap dielectric above the first interconnect structure and above the dielectric layer before forming the second interconnect structure; and
   forming a second cap dielectric above a first cap dielectric and above the second interconnect structure.

7. A structure comprising:
a first interconnect structure; and
a second interconnect structure, the first interconnect structure and the second interconnect structure being different materials,
wherein the first interconnect structure and the second interconnect structure are both within the same metallization level;
wherein the second interconnect structure is in physical contact with the first interconnect structure;
wherein the first interconnect structure is located in a first region of the structure which experiences elevated operating temperatures, and the second interconnect structure is located in a second region of the structure which experiences normal operating temperatures.

8. The structure of claim 7, wherein the second interconnect structure is thicker than the first interconnect structure, the thickness being measured from a top surface of the metallization level to a bottom surface of the metallization level.

9. The structure of claim 7, further comprising:
a first cap dielectric above the first interconnect structure and above a dielectric layer; and
a second cap dielectric above the first cap dielectric and above the second interconnect structure.

10. The structure of claim 7, further comprising:
a via below the first interconnect structure, the via being a different material from the first interconnect structure and a different material from the second interconnect structure.

11. The structure of claim 10, further comprising:
a via below the second interconnect structure, the via being the same material as the second interconnect structure.

12. The structure of claim 7, wherein a portion of the second interconnect structure is above a portion of the first interconnect structure.

13. The structure of claim 7, wherein the second interconnect structure is in physical contact with a top portion of the first interconnect structure.

* * * * *